Jan. 27, 1970 R. H. CRAWFORD 3,492,511
HIGH INPUT IMPEDANCE CIRCUIT FOR A FIELD EFFECT TRANSISTOR
INCLUDING CAPACITIVE GATE BIASING MEANS
Filed Dec. 22, 1966 2 Sheets-Sheet 1

INVENTOR
Robert H. Crawford

United States Patent Office 3,492,511

Patented Jan. 27, 1970

3,492,511

HIGH INPUT IMPEDANCE CIRCUIT FOR A FIELD EFFECT TRANSISTOR INCLUDING CAPACITIVE GATE BIASING MEANS

Robert H. Crawford, Richardson, Tex., assignor to Texas Instruments Incorporated, Dallas, Tex., a corporation of Delaware Filed Dec. 22, 1966, Ser. No. 604,033
Int. Cl. H03k *3/26*
U.S. Cl. 307—304 4 Claims

ABSTRACT OF THE DISCLOSURE

This invention relates to a gate circuit for an insulated gate field effect transistor wherein a biasing capacitor is placed in series between the internal capacitance of the gate, the biasing voltage, and the source so that the internal capacitance of the gate and the capacitance of the biasing capacitor determine the voltage drop between the gate and the source. The circuit thus provides a high input impedance to a signal applied thereto. The biasing capacitor may be manufactured on the same chip as the insulated gate field effect transistor.

This invention relates to metal-oxide-semiconductor field-effect transistors, and more particularly to a capacitor-biasing of such transistors.

The metal-oxide-semiconductor field-effect transistor (MOS-FET) is a voltage control device that exhibits an extremely high input resistance (in the range of about $10^{12}$ to $10^{14}$ ohms). Unlike the junction field-effect transistor, the MOS transistor with its insulated gate maintains a high input resistance without regard to the magnitude of the input gate voltage.

A typical P-channel MOS-FET has two highly doped P conductivity-type regions which are formed in an N conductivity-type silicon substrate. These two regions are referred to as the source and drain, and are located in close proximity to each other. Approximately 0.2 millinch separation is commonly used for a driver device and 1–2 millinches of separation for a load device. A thin layer (800–2000 A.) of insualting material, usually some form of silicon oxide, is formed on the surface of the silicon substrate, the oxide on the substrate surface between the source and drain forming the gate dielectric. A metal layer is evaporated on the surface of the oxide layer including the surface between the source and drain. The metal layer is covered with a mask of photoresist material and subjected to an etching condition for a period of time sufficient to define the source and drain contacts, interconnecting leads and the gate electrode (metal layer on the surface of the oxide between the source and drain) of the MOS-FET.

Because of the conditions created by the interface of the silicon substrate and oxide layer, most N-channel devices are initially on (at zero gate bias) while all P-channel devices are initially off. Since it is desirable to use an initially off device for switching and digital circuits, most commercial MOS-FET's at the present time are single polarity P-channel devices.

With the drain and source grounded, the gate controls the charge in the channel (the region near the substrate surface between the source and the drain). A negative bias applied to the gate modifies the conditions within the silicon between the source and drain. As the gate develops a negative charge, free electrons present in the N conductivity-type silicon are repelled, forming a depletion region. Once sufficient depletion has occurred, additional gate bias attracts positive mobile holes to the surface. When enough holes have accumulated in the channel area, the surface of the silicon changes from electron dominated to hole dominated material and is said to have become inverted. Thus the situation now exists where the two P conductivity-type regions are connected together by a P-conductivity type inversion layer or channel (hence the nomenclature P-channel device). A signal on the gate modulates the number of carriers within the channel region so that the gate, in effect, controls current flowing in the channel.

The normal biasing method for MOS-FET's is to apply a voltage to the gate by a resistor network. Due to the high resistance between the gate and source it is desirable to have the biasing resistor extremely high in resistance, being in the meg-ohm range. However, suitable resistors of this magnitude are difficult to manufacture in small sizes and with good accuracies. Also, in certain applications where high input impedance is important, such as in computer memory systems where information is stored by a charge on a capacitor and operational amplifiers, a resistance network is detrimental due to a low input impedance.

It is therefore an object of the invention to provide a biasing arrangement for biasing a MOS-FET by the use of a biasing capacitor.

The novel features believed to be characteristic of this invention are set forth with particularly in the appended claims. This invention itself, however, as well as further objects and advantages thereof may best be understood by reference to the following detailed description when read in conjunction wtih the accompanying drawings, wherein:

Figures 4, 5A, 5B, 6, 7:
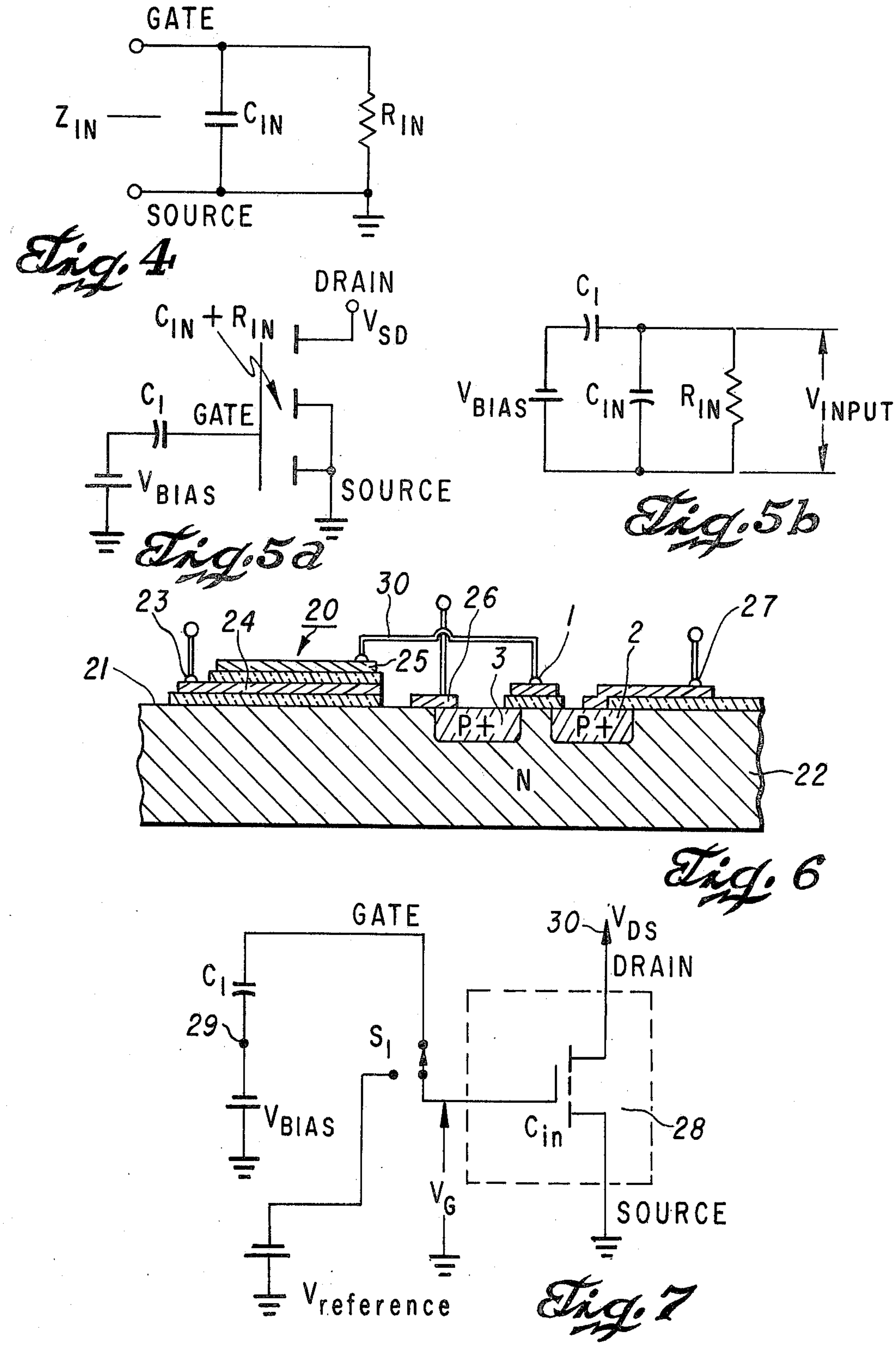
FIGURE 4 is a schematic diagram illustrating an equivalent input circuit of a typical MOS-FET at low input frequencies.

FIGURE *5a* is a schematic diagram illustrating a MOS-FET with a capacitor biasing arrangement;

FIGURE *5b* is a schematic diagram illustrating the equivalent circuit of the MOS-FET circuit shown in FIGURE *5a*;

FIGURE 6 is a sectional view of a portion of a monolithic integrated circuit illustrating a substrate containing a MOS-FET with a biasing capacitor on the surface of the substrate;

FIGURE 7 is a schematic diagram illustrating a capacitor biased MOS-FET used as the input stage of a high voltage electrometer-type circuit.

Briefly, a biasing capacitor is placed in the gate circuit such that it is in series with the internal capacitance of the gate (the internal capacitance is formed by the oxide layer between the gate and the source) and a biasing voltage. Since the internal resistance between the gate and source is high in relationship to the internal capacitance between the gate and source at the instant the bias voltage is applied, the effect of the internal resistance can be neglected at this point in time and the voltage drop between the gate and source (input voltage) is controlled essentially by the internal capacitance and the biasing capacitor. After said capacitance and said capacitor are charged, the voltage of the capacitors decreases due to the current leakage between the plates of each capacitor so that the resistance of each capacitor then determines the voltage drop across each capacitor.

As seen by the equations:

$$\frac{C_1}{C_{in}}=\frac{R_{in}}{R_1}$$

$$V_{input}=V_{bias}\frac{C_1}{C_{in}+C_1}=V_{bias}\frac{R_{in}}{R_{in}+R_1}$$

where $V_{input}$ is the voltage input or the voltage between the gate and source. $V_{bias}$ is the voltage across both the biasing capacitor and the capacitor formed between the gate and source, $C_{in}$ and $R_{in}$ are the internal capacitance and resistance, respectively, between the gate and the source, while $C_1$ and $R_1$ are the capacitance and resistance, respectively, of the biasing capacitor. The voltage input is then the effective gate bias for the MOS–FET. The input voltage may be varied by varying the $V_{bias}$ or $C_1$ ($C_{in}$ being fixed by the geometry of the MOS–FET).

Figures 1, 2:
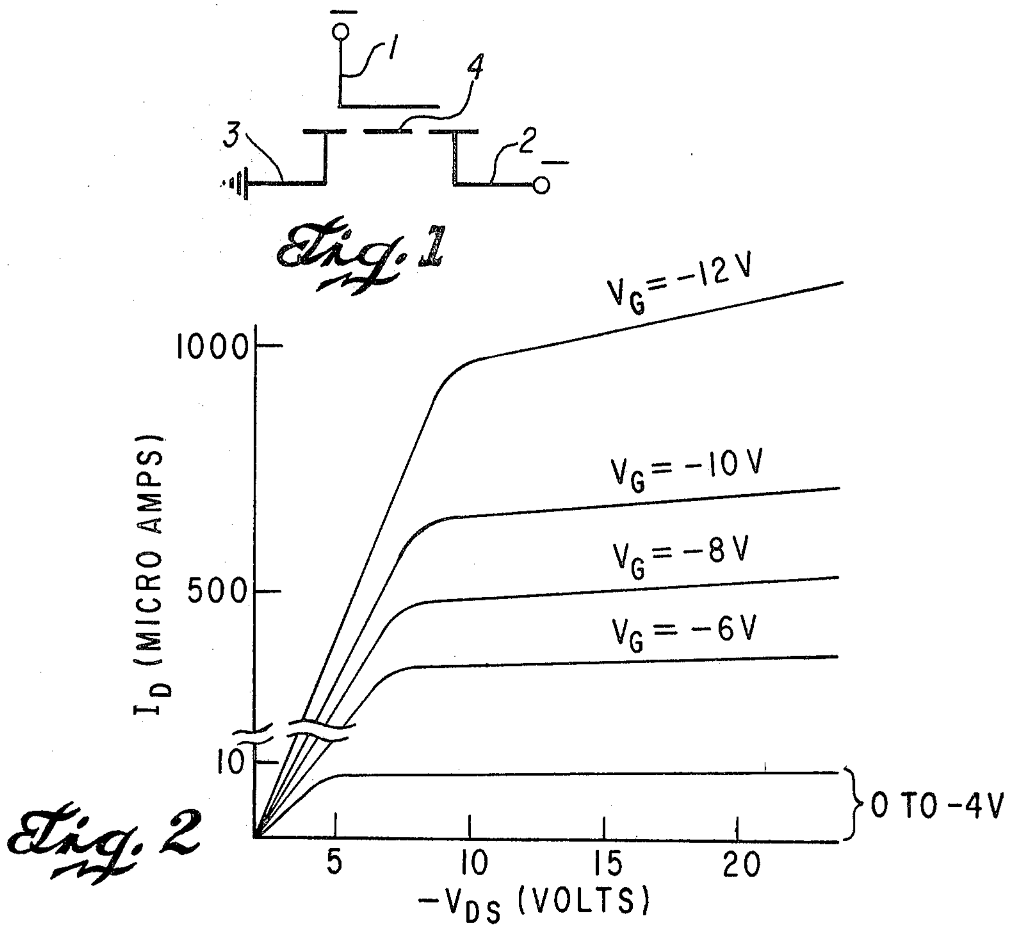
FIGURE 1 is a schematic diagram of a MOS-FET.
FIGURE 2 is a graph of a family of drain current vs. drain-to-source voltage curves at different gate voltages for a typical MOS-FET.

The operation of a MOS–FET can best be explained by first referring to FIGURE 1 which is a schematic diagram of such a device. A MOS–FET comprises a gate 1, a drain 2 and a source 3. Point 4, which is the substrate itself, is sometimes called a back gate and is usually connected in common to the source. Source 3 is usually at ground potential while the drain 2 is at a negative potential. The gate 1 potential is negative also and is of such a value as to lie between ground and the drain voltage.

FIGURE 2 is a graph of drain current $I_D$ versus drain voltage $-V_{DS}$ curves at different gate biasing voltages $V_G$ of a typical MOS–FET. The drain current $I_D$ at a constant drain voltage is controlled by the gate bias $V_G$ with the drain current $I_D$ increasing in magnitude with an increase of the gate bias $V_G$ in a negative direction.

Figure 3:
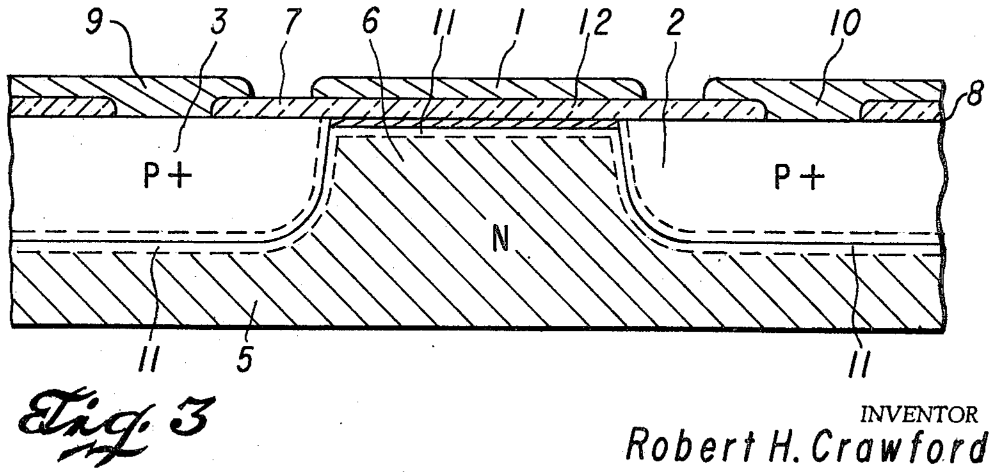
FIGURE 3 is a sectional view of a typical P-channel MOS-FET.

A MOS–FET, as shown in FIGURE 3, is formed by diffusing into an N conductivity-type silicon substrate 5, for example, a P+ conductivity-type source 3 and P+ conductivity-type drain 2 which are separated from each other by a region 6 which is a portion of the N conductivity-type substrate 5 of between about 0.2 millinch to about 2 millinches in thickness. A protective layer of material 7, for example silicon oxide, is formed on the surface 8 of the substrate 5 with windows exposing portions of the P+ conductivity-type source 3 and the P+ conductivity-type drain 2. Metal contacts are then formed on the silicon oxide 7 and the exposed portions of the source 3 and drain 2 to form the source contact 9, the gate 1 and the drain contact 10.

A MOS–FET operates in the enhancement mode which is easily explained by the following sequence of events, referring once again to FIGURE 3. As the gate 1 becomes more negatively biased in relationship to the source 3, a depletion layer 11 is formed along the source-substrate junction, the drain-substrate junction and along the area directly beneath the gate 1. The bias voltage is increased negatively until the threshold voltage is reached, at which time the area directly beneath the gate inverts to a P type region 12 and enables the MOS–FET to operate in what is called the enhancement mode.

The equivalent input circuit of a MOS–FET is shown in FIGURE 4. The input impedance $Z_{in}$ is formed by the effect of the internal capacitance $C_{in}$ and the internal resistance $R_{in}$ between the gate and the source. Typical values of $R_{in}$ are $10^{12}$ to $10^{14}$ ohms and of $C_{in}$ are 0.1 pf. to 1 pf. The internal capacitance (gate capacitance) is always present, for the gate must be separated from the substrate by a layer of oxide for the MOS–FET to operate. The effective bias voltage is the voltage which appears across $C_{in}$. Normally, this bias is applied to the gate through a resistor network.

By using an external capacitor to control the voltage drop between the source and gate, the correct bias can be established to a MOS–FET without using a biasing resistor. In FIGURE *5a* there is illustrated a schematic diagram of a MOS–FET with a capacitor biasing arrangement. FIGURE *5b* illustrates the equivalent circuit of the actual circuit shown in FIGURE *5a*.

The biasing voltage $V_{bias}$ is across the biasing capacitor $C_1$ and the internal resistance $R_{in}$ and internal capacitance $C_{in}$ between the gate and source. The back plate or substrate is connected in common to the source. The input voltage $V_{input}$ is the voltage drop between the gate and source and thus furnishes the necessary biasing action.

The biasing capacitor 20 (FIGURE 6) can be fabricated on the substrate containing the MOS–FET whether the transistor is a discrete device or one among many other components of an integrated circuit, as seen in FIGURE 6. The biasing capacitor 20 is formed by conventional thin film techniques on the surface 21 of the N conductivity type silicon substrate 22. The biasing voltage is applied at terminal 23 to the bottom plate 24 of the biasing capacitor 20, while the top plate 25 of the capacitor 20 is connected to the gate 1 by conductor 30. The source terminal 26 makes contact to the source 3 and substrate 22 (back gate) while the drain terminal 27 makes contact to the drain 2. The voltage drop between the gate 1 and the source 3 biases the MOS–FET.

One application for a capacitor biased MOS–FET is a high-voltage input stage for an electrometer circuit. The arrangement of the input stage of such a circuit is shown in FIGURE 7 with a voltage $V_{bias}$, higher than can normally be applied to an MOS–FET by itself, applied to the input 29 of the circuit. ($V_{bias}$ may be in the order of 100 to 300 volts). This voltage $V_{bias}$ is divided down by the capacitive voltage divider circuit formed by capacitor $C_1$ and the internal capacitance $C_{in}$ of the MOS–FET. The input voltage that appears across $C_{in}$ biases the MOS–FET. The value of this input voltage is set by the ratio of $C_{in}$ and $C_1$ and is much lower than $V_{bias}$. The output $V_{DS}$ of the circuit is measured at the drain terminal 30.

The above described capacitor biased MOS-FET has an advantage over a MOS-FET whose gate oxide is made thick enough to withstand the full biasing voltage $V_{bias}$. This advantage is illustrated in the circuit schematic shown in FIGURE 7. The MOS-FET is designed to operate with an input voltage in the range of 4 to 10 volts. To calibrate the input electrometer-type circuit shown above it is necessary to observe the output while a known voltage standard $V_{ref}$ is applied to the MOS-FET gate by the switch $S_1$ which has one terminal connected to the reference voltage $V_{ref}$ and a second terminal connected to the biasing capacitor $C_1$. A voltage reference in the order of 5 to 6 volts can be used. This is in the range of temperature compensating Zener diodes. If the gate oxide of the MOS-FET is made thick enough to withstand all the biasing voltage $V_{bias}$, then the reference voltage $V_{ref}$ would have to be of the same order (100–300 volts). This higher voltage is more difficult to achieve than a 5 volt reference source. A second advantage the invention has over a MOS-FET without capacitor bias is the fact that a number of capacitors ($C_1$) can be fabricated on the same chip with leads brought out to an external switch. Thus by varying the value of $C_1$ the voltage scale of the circuit is changed.

Various modifications of the invention will become apparent to persons skilled in the art without departing from the spirit and scope of the invention as defined by the appended claims.

What is claimed is:

1. A high input impedance gate circuit for an insulated gate field effect transistor comprising:
   (a) an insulated gate field effect transistor including a drain, a source, and a gate, said source and said gate having an internal capacitance between them,
   (b) a nonpolar biasing capacitor means connected in series with said gate,
   (c) voltage means connected to said source and said biasing capacitor means for providing a biasing voltage across said biasing capacitor means and cross said source and gate internal capacitance, said biasing capacitor means together with said source and gate capacitance being means for controlling the voltage drop between said source and gate and providing a high input impedance to an input signal applied to said gate of the transistor.

2. A circuit as recited in claim 1 wherein said insulated gate field effect transistor and said biasing capacitor means are formed on a common substrate.

3. A circuit as recited in claim 2 wherein said insulated gate field effect transistor is a P-channel device operating in the enhancement mode and the substrate is of N conductivity type silicon.

4. An electrometer circuit comprising:
   (a) an insulated gate field effect transistor having a source, a gate, and a drain, said source and gate having an internal capacitance, said drain providing a voltage signal output and said source being connected to ground,
   (b) a nonpolar biasing capacitor means connected to said gate,
   (c) a biasing voltage source connected in series with said biasing capacitor means and
   (d) means for connecting a voltage source to be measured to the gate of said transistor, said biasing capacitor means together with said source and gate internal capacitance providing a voltage divider for determining the potential of an input voltage source connected to said gate.

References Cited

UNITED STATES PATENTS

| | | | |
|---|---|---|---|
| 3,325,654 | 6/1967 | Mrazek | 307—303 |
| 3,343,049 | 9/1967 | Miller et al. | 317—234 |
| 3,138,744 | 6/1964 | Kilby | 317—235 X |
| 3,202,840 | 8/1965 | Ames | 317—235 X |
| 3,296,508 | 1/1967 | Hofstein | 317—235 |
| 3,313,959 | 4/1967 | Dill | 317—235 X |
| 3,356,858 | 12/1967 | Wanlass | 317—235 X |

JAMES D. KALLAM, Primary Examiner

U.S. Cl. X.R.

317—235, 238